(12) United States Patent
Yogev

(10) Patent No.: US 6,829,035 B2
(45) Date of Patent: Dec. 7, 2004

(54) ADVANCED MASK CLEANING AND HANDLING

(75) Inventor: David Yogev, Nesher (IL)

(73) Assignee: Applied Materials Israel, Ltd., Rehovot (IL)

(*) Notice: Subject to any disclaimer, the term of this patent is extended or adjusted under 35 U.S.C. 154(b) by 0 days.

(21) Appl. No.: 10/293,591

(22) Filed: Nov. 12, 2002

(65) Prior Publication Data

US 2004/0090605 A1 May 13, 2004

(51) Int. Cl.$^7$ .................. G03B 27/52; G03B 27/42; G01N 21/00; A61N 5/00
(52) U.S. Cl. .................. 355/30; 355/53; 356/237.4; 250/492.2
(58) Field of Search .................. 355/30, 53, 67, 355/75; 356/237.4, 237.5; 250/492.2; 430/5; 427/350; 438/115, 906

(56) References Cited

U.S. PATENT DOCUMENTS

| | | | | |
|---|---|---|---|---|
| 4,676,637 A | * | 6/1987 | Uto et al. | 356/237.4 |
| 5,634,230 A | * | 6/1997 | Maurer | 15/1.51 |
| 5,652,657 A | * | 7/1997 | Yoshii et al. | 356/394 |
| 6,038,015 A | * | 3/2000 | Kawata | 355/67 |
| 6,284,417 B1 | * | 9/2001 | Williams | 430/5 |
| 6,327,021 B1 | * | 12/2001 | Higashiguchi | 355/30 |
| 6,466,315 B1 | * | 10/2002 | Karpol et al. | 356/237.4 |
| 6,566,169 B1 | * | 5/2003 | Uziel et al. | 438/115 |
| 2002/0109824 A1 | * | 8/2002 | Yamaguchi et al. | 355/53 |
| 2002/0145711 A1 | * | 10/2002 | Magome et al. | 355/30 |

FOREIGN PATENT DOCUMENTS

WO    WO 00/38935    *  7/2000

* cited by examiner

Primary Examiner—Alan Mathews
(74) Attorney, Agent, or Firm—Blakely, Sokoloff, Taylor & Zafman LLP

(57) ABSTRACT

Apparatus for semiconductor device fabrication, includes at least one lithography station, which is adapted to project a pattern of radiation from a mask onto a semiconductor wafer. A mask cleaning station is adapted to receive the mask from the at least one lithography station, to clean the mask so as to remove a contaminant therefrom, and so that the cleaned mask may be returned to the at least one lithography station. A robot is adapted to convey the mask between the at least one lithography station and the mask cleaning station. An enclosure contains the at least one lithography station, the mask cleaning station and the robot, so that the mask is conveyed between the at least one lithography station and the mask cleaning station without human contact and without exposure to ambient air.

17 Claims, 5 Drawing Sheets

ADVANCED MASK CLEANING AND HANDLING

FIELD OF INVENTION

The present invention relates generally to semiconductor manufacturing processes, and specifically to methods and apparatus for cleaning and handling of lithographic masks used in producing semiconductor devices.

BACKGROUND OF INVENTION

As the trend continues to reduce the size of semiconductor devices, optical lithography using conventional transmission masks, such as chrome on glass (COG) or phase shift (PSM) masks, will no longer suffice as a viable technique for printing advanced devices on semiconductor wafers. Transmission lithography has been extended to ever shorter wavelengths, down to 157 nm in the far ultraviolet (UV), in order to reduce the size of device features. However, the still shorter wavelengths necessary for printing even smaller device structures are readily absorbed in transmission materials. Alternative technological candidates to replace optical lithography include: electron projection lithography (EPL) and an all-reflective technology called extreme ultra-violet lithography (EUVL).

Virtually all masks used in production today employ a pellicle to protect the mask surface from particulate contamination. The pellicle is a relatively inexpensive, thin, transparent, flexible sheet, which is stretched above and not touching the surface of the mask. Pellicles provide a functional and economic solution to particulate contamination by mechanically separating particles from the mask surface. The mask is transported and used for lithographic exposure with the pellicle in place. When a mask is used for exposure, with the pellicle in position above the mask, only the details of the mask's focal plane itself are printed. Particulate material located on the pellicle surface is maintained outside of the focal plane of projection. As a result, particulate material is not printed. When the pellicle eventually becomes damaged or too dirty to use, the mask is removed to a workshop, and the pellicle is replaced.

A suitable pellicle material and structure have yet to be defined for 157 nm technology. The options to date include using either no pellicle or a very expensive hard pellicle. An inexpensive soft pellicle that is capable of withstanding multiple exposures to 157 nm light has yet to be developed. It appears, therefore, that masks for lithography at 157 nm and for shorter wavelengths must be used without the protection of a pellicle. If a no-pellicle option is chosen, the masks must be cleaned frequently, and the cleaning technique must be suitable for multiple cleaning cycles without inducing any significant damage to sensitive mask films. Most contaminants absorb radiation at short wavelengths, and it is therefore imperative that the mask surface be completely free of any contamination that may absorb radiation.

Not only must mask particle contamination removal efficiency be increased, but the minimum particle size to be removed must also decrease. For example, in EUV lithography, masks must be cleaned to remove particles as small as 70 nm, since particles of this size are already printable at EUV lithography wavelengths. Conventional cleaning technologies such as sulfuric-peroxide mixture (SPM) and standard cleans (SC-1 and SC-2) do not fulfill all of the previously mentioned contamination removal criteria. If these conventional cleaning procedures must be applied to the mask repeatedly (due to the absence of a mask pellicle), they are likely to cause rapid degradation of delicate mask film layers.

Various methods are known in the art for stripping and cleaning foreign matter from the surfaces of semiconductor wafers and masks, while avoiding damage to the surface itself. For example, U.S. Pat. No. 4,980,536, whose disclosure is incorporated herein by reference, describes a method and apparatus for removal of particles from solid-state surfaces by laser bombardment. U.S. Pat. Nos. 5,099,557 and 5,024,968, whose disclosures are also incorporated herein by reference, describe methods and apparatus for removing surface contaminants from a substrate by high-energy irradiation. The substrate is irradiated by a laser with sufficient energy to release the particles, while an inert gas flows across the wafer surface to carry away the released particles.

U.S. Pat. No. 4,987,286, whose disclosure is likewise incorporated herein by reference, describes a method and apparatus for removing minute particles (as small as submicron) from a surface to which they are adhered. An energy transfer medium, typically a fluid, is interposed between each particle to be removed and the surface. The medium is irradiated with laser energy and absorbs sufficient energy to cause explosive evaporation, thereby dislodging the particles.

Various methods are known in the art for discriminating and localizing defects on substrates. U.S. Pat. Nos. 5,264,912 and 4,628,531, whose disclosures are incorporated herein by reference are examples. Foreign particles are one type of defects that can be detected using these methods.

U.S. Pat. No. 5,023,424, whose disclosure is incorporated herein by reference, describes a method and apparatus using laser-induced shock waves to dislodge particles from a wafer surface. A particle detector is used to locate the positions of particles on the wafer surface. A laser beam is then focused at a point above the wafer surface near the position of each of the particles, in order to produce gas-borne shock waves with peak pressure gradients sufficient to dislodge and remove the particles. It is noted that the particles must be dislodged by the shock wave, rather than vaporized due to absorption of the laser radiation. U.S. Pat. No. 5,023,424 further notes that immersion of the surface in a liquid (as in the above-mentioned U.S. Pat. No. 4,987,286, for example) is unsuitable for use in removing small numbers of microscopic particles.

SUMMARY OF INVENTION

It is an object of some aspects of the present invention to provide improved methods and apparatus for removal of microscopic particles from lithographic masks used in semiconductor device production. In the context of the present patent application and in the claims, the word "particle" is used broadly to refer to any contaminant or other foreign substance that must be removed from the mask surface.

In embodiments of the present invention, a lithography tool, for use in producing semiconductor devices, comprises one or more lithography stations, together with a mask cleaning station. The lithography and mask cleaning stations are contained in a common enclosure, and a robot is preferably used to transfer the masks between the cleaning and lithography stations in order to isolate the mask and the stations from ambient air and from human contact. This arrangement is particularly advantageous in dealing with masks without pellicles, since it allows particles to be removed frequently from the masks, in the production environment, without removing the masks to a separate mask shop. This arrangement facilitates the higher level of mask cleanliness that is required for far UV and EUV lithography.

Preferably, the lithography tool also comprises an inspection station, which checks each mask before or after use to verify that the mask is still clean and, if not, to determine the locations of any contaminant particles on the mask. If the inspection station finds the mask to be contaminated, the robot passes the mask to the cleaning station. Based on coordinates of the particles determined by the inspection station, the cleaning station applies a local cleaning process to remove the particles. Preferably, the local cleaning process involves wetting the particle location with a suitable fluid, and then irradiating the location with laser radiation, most preferably UV laser radiation. This cleaning approach gives optimal removal of contaminant particles, without affecting in any way the remainder of the mask.

Alternatively, various other local cleaning methods may be used in conjunction with the inspection station. Examples of such methods include localized plasma application; local application of pressurized gas or vacuum; and local application of carbon dioxide dry ice (or "snow cleaning"). In addition, chemical cleaners in liquid and/or vapor state may be locally dispensed at the particle coordinates. In any case, when local cleaning is used, degradation of the mask due to frequent cleaning is minimized, and the useful life of the mask is thus lengthened.

There is therefore provided, in accordance with an embodiment of the present invention, apparatus for semiconductor device fabrication, including:

at least one lithography station, which is adapted to project a pattern of radiation from a mask onto a semiconductor wafer;

a mask cleaning station, which is adapted to receive the mask from the at least one lithography station, to clean the mask so as to remove a contaminant therefrom, so that the cleaned mask may be transferred to the at least one lithography station;

a robot, which is adapted to convey the mask between the at least one lithography station and the mask cleaning station; and an enclosure, containing the at least one lithography station, the mask cleaning station and the robot, so that the mask is conveyed between the at least one lithography station and the mask cleaning station without human contact and without exposure to ambient air.

Preferably, the apparatus includes a mask storage station, contained at least partly within the enclosure, and the mask storage station is adapted to store the mask, and the robot is adapted to convey the mask between the mask storage station and the cleaning and lithography stations. Further preferably, the at least one lithography station includes a radiation source for generating the radiation that is projected onto the semiconductor wafer, and the radiation has a wavelength that is less than 160 nm.

In one embodiment, the at least one lithography station is adapted to project the pattern of radiation from the mask in the absence of a pellicle covering the mask. The at least one lithography station may include a plurality of exposure tools, commonly contained within the enclosure and served by the mask cleaning station.

Preferably, the apparatus includes an inspection station, which is adapted to determine position coordinates of the contaminant on the mask, and to convey the coordinates to the cleaning station, which is adapted to clean the mask locally at a location indicated by the coordinates. Most preferably, the inspection station is contained within the enclosure. In one embodiment, the cleaning station includes a vacuum source, which is adapted to apply suction at the location indicated by the coordinates. The cleaning station may additionally include an inlet port, and may be adapted to inject a fluid medium through the inlet port so that the fluid medium is deposited on the mask at the location indicated by the coordinates, prior to applying the suction thereto.

In another embodiment, the cleaning station includes an inlet port, and is adapted to inject a pressurized cleaning medium through the inlet port so that the cleaning medium impinges on the mask at the location indicated by the coordinates.

Preferably, the cleaning station includes a radiation source, which is adapted to generate a beam of electromagnetic energy, and the cleaning station is adapted to controllably direct the beam of electromagnetic energy toward a location of the contaminant on the mask, causing the contaminant to be dislodged from the mask substantially without damage to the surface itself. Preferably, the cleaning station includes a gas inlet, and the cleaning station is adapted to inject an energy transfer medium through the gas inlet so that the medium is deposited on the mask at the location of the contaminant. Most preferably, the medium absorbs at least a portion of the electromagnetic energy incident on the mask, causing local evaporation of the medium, which dislodges the contaminant. Preferably, the electromagnetic energy includes ultraviolet laser energy. Further preferably, the energy transfer medium includes a carrier gas with a condensable vapor. Typically, the condensable vapor is water.

Further preferably, the cleaning station is adapted to receive input position coordinates of the location of the contaminant on the mask, and to direct the medium and the beam so that the medium and beam are incident on the mask at the location indicated by the position coordinates. Most preferably, the cleaning station further includes an inspection station, which is adapted to determine the input position coordinates and to convey the coordinates to the cleaning station.

There is also provided, in accordance with an embodiment of the present invention, a method for semiconductor device fabrication, including the steps of:

enclosing at least one lithography station and a mask cleaning station in an enclosure, so that a mask may be conveyed between the at least one lithography station and the mask cleaning station without human contact and without exposure to ambient air;

cleaning the mask in the mask cleaning station so as to remove a contaminant therefrom;

conveying the mask within the enclosure from the mask cleaning station to the at least one lithography station; and projecting a pattern of radiation from the mask onto a semiconductor wafer in the at least one lithography station.

Preferably, projecting the pattern of radiation includes generating the radiation at a wavelength that is less than 160 nm. Further preferably, projecting the pattern of radiation includes projecting the pattern of radiation from the mask in the absence of a pellicle covering the mask.

Preferably, the method includes storing the mask in a mask storage station, which is at least partially contained in the enclosure, and conveying the mask includes transferring the mask between the at least one lithography station, the mask cleaning station, and the mask storage station. Further preferably, cleaning the mask includes determining position coordinates of the contaminant on the mask, and cleaning the mask locally at a location indicated by the coordinates. Most preferably, determining the position coordinates includes enclosing an inspection station within the enclosure, and inspecting the mask using the inspection station.

Preferably, cleaning the mask includes controllably directing a beam of electromagnetic energy toward a location of the contaminant on the mask, so as to cause the contaminant to be dislodged from the mask substantially without damage to the mask itself. Further preferably, cleaning the mask also includes controllably applying an energy transfer medium at the location of the contaminant on the surface, wherein the beam of electromagnetic energy causes local evaporation of the medium, thereby dislodging the contaminant.

Preferably, the electromagnetic energy includes ultraviolet laser energy.

Preferably, controllably directing the electromagnetic energy includes receiving input position coordinates of the location of the contaminant on the mask, and directing the beam so that the beam is incident on the mask at the location indicated by the position coordinates.

BRIEF DESCRIPTION OF THE DRAWINGS

The present invention will be more fully understood from the following detailed description of the embodiments thereof, taken together with the drawings in which.

DETAILED DESCRIPTION OF EMBODIMENTS

Figure 1:
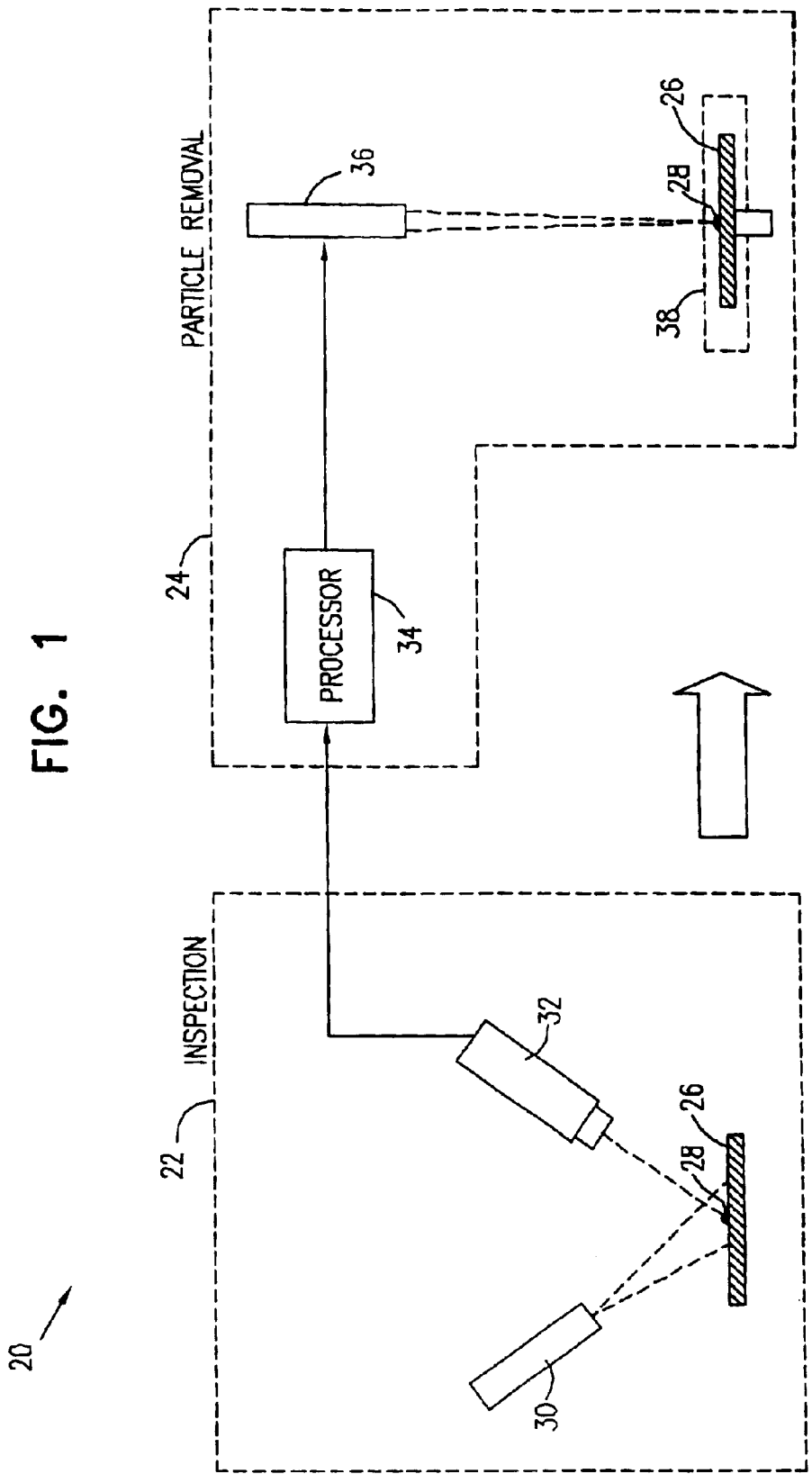
FIG. 1 is a schematic illustration of a system for removal of particles from the surface of a lithographic mask, in accordance with an embodiment of the present invention.

FIG. 1 is a schematic illustration of a system 20 for removal of particles from the surface of a lithographic mask 26, in accordance with an embodiment of the present invention. System 20 is similar in certain aspects to cleaning systems described in U.S. patent application Ser. No. 09/869,058 and in PCT patent application PCT/IL99/00701, which are assigned to the assignee of the present patent application and are incorporated herein by reference.

System 20 comprises two stations: an inspection station 22 and a particle removal station 24. Typically, stations 22 and 24 are separate entities, as shown in the figure. Inspection station 22 determines the coordinates of contaminant particles 28 on the surface of the mask. The coordinates are passed to a processor 34, which stores the coordinates and transforms them to a coordinate frame of particle removal station 24. Processor 34 has additional functions, as further described with reference to FIG. 2, below. Mask 26 is then transferred to particle removal station 24, where the coordinates are used to direct the removal of the particles from the surface. Alternatively, stations 22 and 24 are constructed as a single, integral unit, which both determines the particle coordinates and removes the particles accordingly, without the need to transfer the mask from one entity to the next.

Inspection station 22 may comprise any suitable automated inspection system known in the art, such as the defect detection systems mentioned in the Background of the Invention. For example, the Applied Materials "Compass" or KLA-Tencor "Surfscan" systems may be used for this purpose. Typically, a laser 30 irradiates the surface of mask 26, and a detector 32 senses irregularities in the radiation reflected from the surface. Alternatively, other inspection methods, such as optical microscopy or scanning electron microscopy (SEM), may be employed. The irregularities are analyzed to determine the coordinates of particles 28, and possibly of other surface defects, as well. Preferably, station 22 is capable of distinguishing between irregularities due to particles and due to other causes. Alternatively, if station 22 does not make the distinction between particles and other defects, station 24 may attempt (without success) to treat inspected locations of defects that are not removable particles. Aside from reducing the throughput of system 20, it is not likely that any harm will result to mask 26 due to the processing of these non-particle defects by station 24.

Particle removal station 24 comprises a laser 36, which directs an intense beam of energy at the surface of mask 26. In some embodiments of the present invention, the laser comprises an excimer laser, such as a Lambda Physik LPX315 IMC laser, which emits ultraviolet radiation. Alternatively, other laser types and wavelengths, such as infrared or visible lasers, may be used. The mask is contained in a chamber 38, which is described in detail hereinbelow. The laser energy is absorbed at the mask surface, causing particles 28 to be dislodged from the surface substantially without damage to the surface itself. Typically, absorption of the laser energy, by the particles and/or by the mask, causes the particles to be ablated or otherwise dislodged from the surface, as described, for example, in the above-mentioned U.S. Pat. No. 5,114,834 or in PCT patent application PCT/IL96/00141, which is also incorporated herein by reference. Additionally or alternatively, as described in the above-mentioned U.S. Pat. No. 4,987,286, an energy transfer medium is applied to the surface. The laser energy, absorbed by the medium and/or by the mask, causes explosive evaporation, thereby dislodging the particles. Further alternatively, station 24 may use any other suitable method of localized particle removal that is known in the art.

Figure 2:
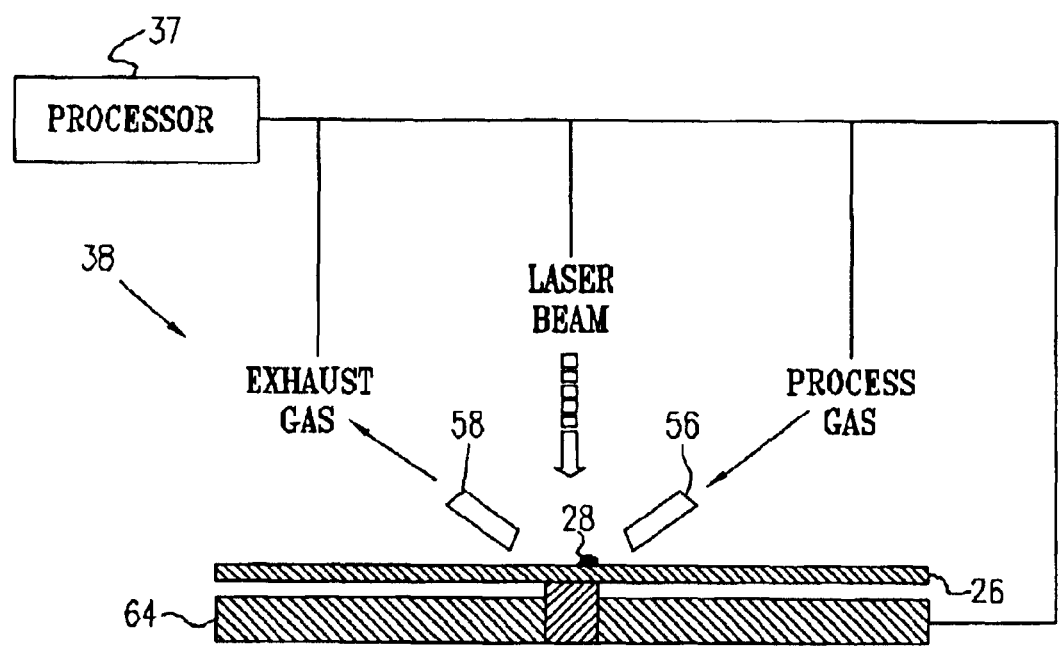
FIG. 2 is a schematic, sectional illustration of a lithographic mask in a particle removal chamber, in accordance with an embodiment of the present invention.

Reference is now made to FIG. 2, which schematically illustrates details of chamber 38, in accordance with an embodiment of the present invention. FIG. 2 is a sectional side view. Chamber 38 comprises a rotating chuck 64, on which mask 26 rests securely (typically by vacuum suction, as is known in the art). The laser beam irradiates the mask surface at points where inspection station 22 has detected particles. To remove any one of particles 28, chuck 64 is rotated so that the particle is located under the laser beam, which is fired at the surface in the region of the particle. Radial scanning of the laser beam may be accomplished either by angular deflection of the beam, using any sort of suitable optical scanner, or by translating an optical beam-handling assembly (or even the entire laser) over the mask in a radial direction. These and other suitable methods of scanning will be apparent to those skilled in the art.

Preferably, a process gas mixed with a vapor is introduced through a process gas port 56. The vapor condenses to form a liquid film on the surface. Most preferably, the process gas comprises a gas or a combination of gases having inert properties, such as nitrogen, and a vapor such as water vapor. In this case, laser irradiation causes explosive local evaporation of the liquid, driving the particles off the mask surface.

The gas from region 60 is preferably exhausted through one or more gas exhaust ports 58. As these ports are immediately adjacent to region 60, the particles removed from the mask surface will generally be swept immediately out of the region and away from the mask surface. By minimizing the distance that released particles must travel over the mask surface, station 24 thus reduces the likelihood that a released particle will settle back down on another part of the mask surface. Rapid and efficient removal of the released particles is very important, because when released particles do settle back down on the mask, they may be even harder to remove than they were initially.

Processor 37, in addition to receiving particle coordinates from the inspection station, preferably controls and coordinates other aspects of station 24, including the laser beam, the process gas and exhaust flows, and the chuck.

Although IR laser radiation has typically been used in the past to cause evaporative explosion of water film on semiconductor wafer cleaning (as described in the previously-mentioned U.S. Pat. No. 4,987,286), this approach may not be appropriate for advanced masks such as an Extreme Ultra Violet (EUV) mask. Such masks typically comprise 40 or more alternating layers of Si and Mo. The Si layers are practically transparent to IR radiation, while the Mo layers strongly absorb IR radiation. Therefore, IR irradiation of such a mask may cause differential heating of the Mo layers, leading to undesirable strain in the multilayer structure.

Therefore, to avoid undesirable thermal effects and possible substrate damage, the laser beam preferably comprises visible or ultraviolet (UV) radiation, at wavelengths selected to accommodate the absorption characteristics of Mo and Si. Examples of two specific wavelengths that may be used for this purpose are 248 nm and 532 nm. In addition, IR radiation may be used, preferably at 2940 nm (tuned to the O—H stretch mode of water, for maximum radiation absorption in the liquid film on the mask surface). Experimental cleaning results using these wavelengths are described below.

Figure 3:
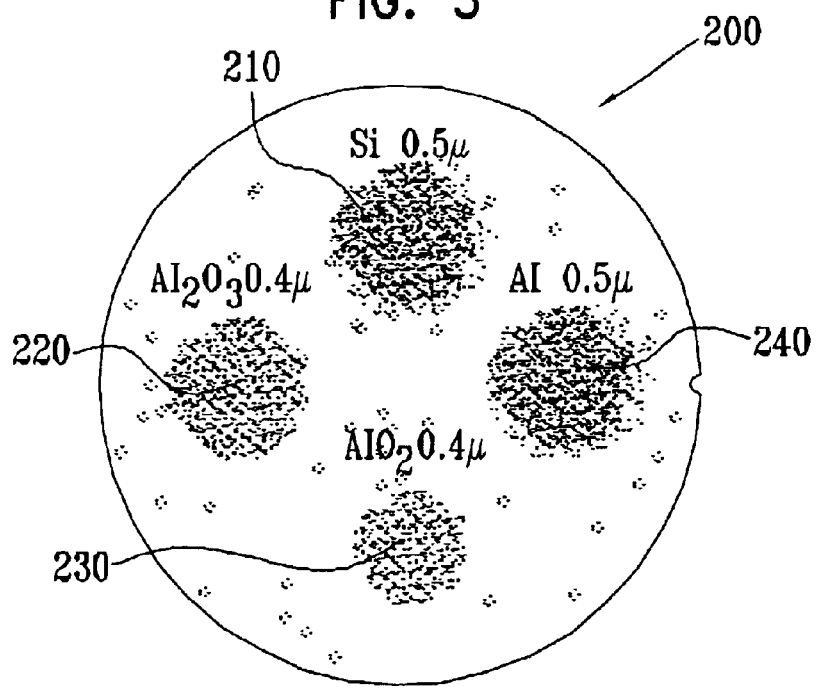
FIG. 3 is a schematic top view of a mask on which contaminant particles have been deposited.

FIG. 3 is a schematic top view of a blank mask 200 on which known particles have been deposited. Mask 200 comprises 40 alternating layers of Si and Mo with thicknesses of 40 Å each on a Si substrate. Groups of calibrated particles are deposited on mask 200 as follows: group 210—Si 0.5 μm; group 220—$Al_2O_3$ 0.4 μm; group 230—$SiO_2$ 0.4 μm; and group 240—Al 0.5 μm. Station 24 was applied to remove the particles from the mask, using laser radiation at the three wavelengths previously noted (532 nm, 248 nm, and 2940 nm).

Figure 4:
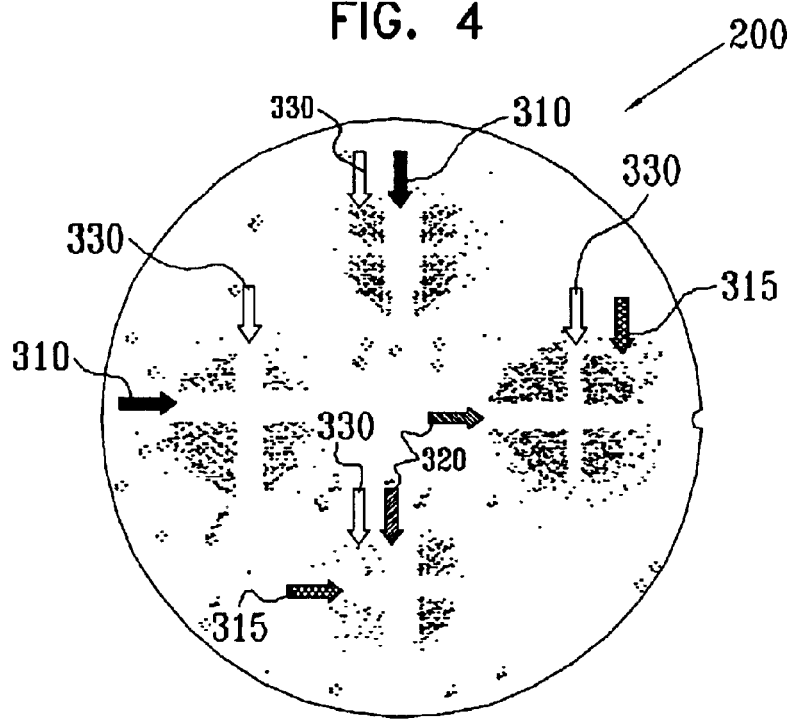
FIG. 4 is a schematic top view of the mask of FIG. 3 following removal of the contaminant particles using the system of FIG. 2.

FIG. 4 is a schematic top view of the mask of FIG. 3 showing cleaning results obtained using laser radiation at 532 nm, 248 nm and 2940 nm. Arrows 310 indicate cleaning passes performed on groups 210, 220, 230 and 240 using laser radiation at 532 nm and at 248 nm. Arrows 315 indicate cleaning passes performed at 532 nm. Arrows 320 indicate cleaning passes performed at 248 nm. Arrows 330 indicate cleaning passes performed at 2940 nm. Each of three radiation wavelengths yielded good cleaning results.

In all cases, damage to the blank mask was rarely observed. Any damage observed was limited to parts of the mask where particles were located. Damage could be attributable to lack of synchronization between the laser beam firing and the flow of gases yielding the water film on the surface. Another possible contributor to damage was poor laser beam quality, as a correlation was found between damage locations and hot spots in the laser beam profile. Damage was observable in the form of mask reflectivity changes. Such changes, when they occurred, could be observed with a naked eye under strong light illumination and appeared to be similar in shape to the laser beam spot profile. These results were also observed using instruments including a Tencor 7200 wafer scanner, an optical microscope, scattered probe laser beam images, and a SEM. Surprisingly, little or no mask damage was observed at the 2940 nm laser wavelength. This result may have been due to increased IR absorption in the thin Si layers because of increased free electron density, which would tend to balance out the higher absorption in the Mo layers.

The examples shown in FIGS. 3 and 4 above are for illustrative purposes only and are not intended to limit the method of localized cleaning to a given type of laser, laser wavelength, or specific mask type. In general, other types of lasers and laser wavelengths may be used, according to specific needs. Alternatively, particle removal station 24 may use other local cleaning methods in conjunction with inspection station 22. For example, station 24 may apply localized plasma, pressurized gas or vacuum, or carbon dioxide "snow" (dry ice—using a special nozzle such as those produced by Applied Surface Technologies). In addition, station 24 may dispense chemical cleaners in liquid and/or vapor state locally at the particle coordinates.

Figure 5:
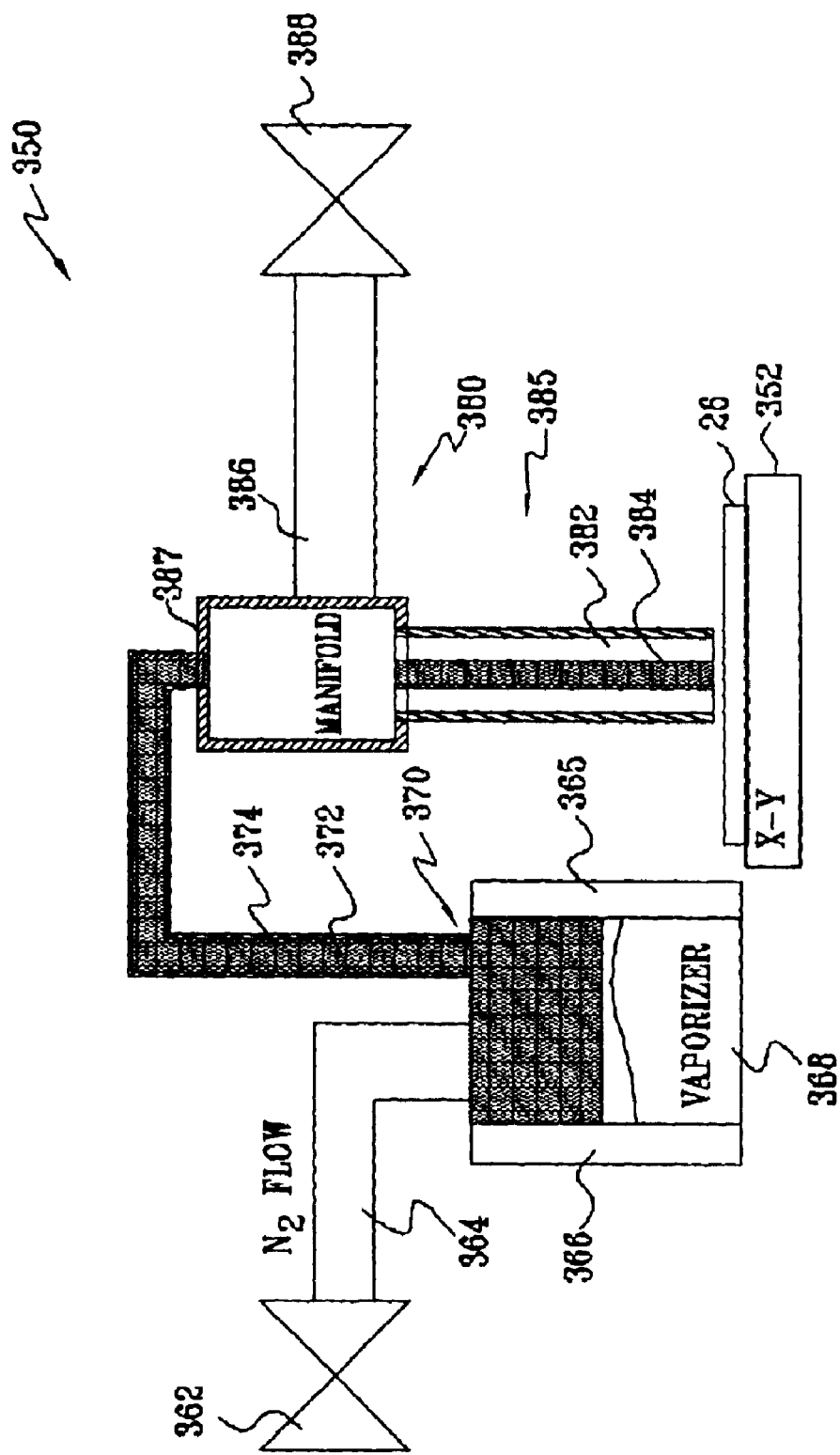
FIG. 5 is a schematic side view of a system for removal of particles from the surface of a lithographic mask, in accordance with another embodiment of the present invention.

FIG. 5 is a simplified pictorial illustration of a particle removal station 350, in accordance with an alternative embodiment of the present invention. The principles of operation of station 350 are described in detail in U.S. Patent Application titled "CONDENSATION-BASED ENHANCEMENT OF PARTICLE REMOVAL BY SUCTION", application Ser. No. 10/035,972, filed Sep. 11, 2001, which is assigned to the assignee of the present patent application, and whose disclosure is incorporated herein by reference.

Station 350 comprises a fluid delivery unit 370 and a suction unit 380. The fluid delivery unit deposits a fluid, preferably a vapor, onto mask 26 at the locations of contaminants determined by inspection station 22, and the suction unit then removes the contaminants together with the fluid. The introduction of the fluid onto the particle, coupled with a turbulent mass-transfer regime surrounding the particle induced by a suction force from suction unit 380, introduces a mechanical shock to the particle. The mechanical shock, coupled with the dissolution forces of the particle into the fluid phase, tends to release the particle from the surface of the mask. Alternatively, the local suction unit may be used alone, without wetting the mask.

Fluid delivery unit 370 comprises a gas inlet valve 362, and a gas-conveying channel 364. This channel conveys nitrogen or an inert gas to a vaporizer chamber 368. The chamber is normally constructed with an external heating jacket 366 and a liquid entry channel (not shown). The liquid may be, for example, water, a solvent, or an aqueous solution. The liquid is heated, typically from 40–80° C., by jacket 366 so as to be partially or fully vaporized or to enter a gaseous phase. This phase or combination of liquid and/or vapor and/or gaseous phases is defined herein broadly as a fluid. The fluid may thus also comprise steam.

The fluid is conveyed from vaporizer 368 via a fluid channel 372 to the surface of mask 26. Channel 372 is typically heated externally by a heating jacket 374 or other means known in the art. Typically, vaporizer 368 comprises a heating element 365, which is configured to transfer heat to heating jackets 366 and 374. Preferably, heating jacket 374 is extended so as to heat a fluid delivery channel 384 and a suction channel 382 concomitantly.

Suction unit 380 typically comprises a vacuum or displacement pump (not shown) which introduces reduced pressure or vacuum forces to a channel 386. The channel may be under continuous or non-continuous suction. The suction is controlled by the activation of a valve 388 leading to channel 386. Channel 386 leads to a nozzle assembly 385 having two channels. A fluid delivery channel 384, typically the inner channel, conveys the fluid phase to mask 26. A suction channel 382, typically an outer annular channel, conveys particles and fluid from the surface under suction forces.

Mask 26 is typically supported on an x-y stage 352 with the fluid delivery and suction channels 384 and 382 controlled to reach any coordinate on the x-y stage. Alternately, the stage may be a rotating stage, and the channels may be operated to reach any point by radial movement.

Figure 6:
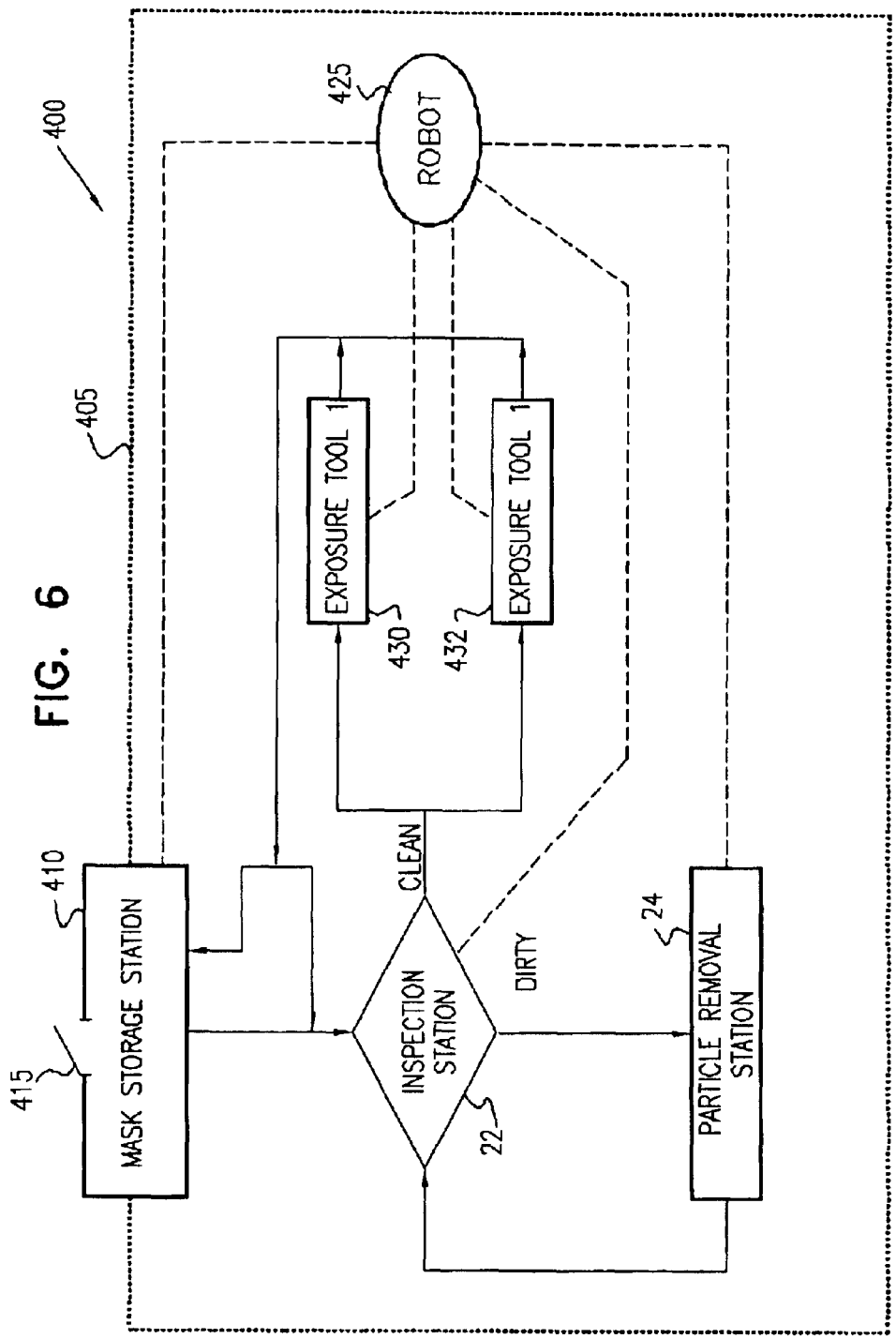
FIG. 6 is a simplified block diagram showing a lithography tool with mask handling and particle removal capabilities, in accordance with an embodiment of the present invention.

FIG. 6 is a simplified block diagram showing a lithography tool 400 with integrated local particle removal, in accordance with an embodiment of the present invention. All the elements of tool 400, including inspection station 22 and particle removal station 24 (as shown initially in FIG. 1), are maintained in a controlled environment within an enclosure 405. Thus, masks generally need not be removed from enclosure 405 for particle removal, and exposure of the masks to environmental contaminants is accordingly reduced. The entire interior of enclosure 405 may be evacuated if desired.

Lithographic masks to be used in tool 400 are inserted into a mask storage station 410 through an exterior port 415. The masks held in station 410 are preferably inspected and cleaned before use, using the inspection station and particle removal station. Preferably, masks in storage are inspected and cleaned periodically even when not in use, as well, in order to promptly remove any particles that may have adhered to the mask. Masks are transferred from the mask storage station to the inspection station by a robot 425, without human contact. Inspection station 22 inspects the surface of the mask and detects any contaminant particles that may be present on its surface. If the mask is found to be clean of particles, robot 425 transfers the mask to an exposure station 430 or 432, which exposes the lithographic pattern of the mask onto at least one semiconductor wafer. Alternatively, if the mask is not required for use in one of the exposure tools, it is returned to storage station 410. Mask transfers between the exposure tools and/or between the mask storage station are effected by the robot.

After each use of the mask in exposure tool 430 or 432, the mask is preferably re-inspected by the inspection station. In this way, it is ensured that any particles that may be deposited on the mask are detected and subsequently removed before the next time the mask is used. Alternatively, for increased throughput of tool 400, the masks are re-inspected only after having been used for a certain number of exposures.

If the inspection station determines that particles must be removed from the mask, robot 425 transfers the mask to particle removal station 24 and particles are removed as described previously with reference to FIG. 2. When removal of particles from the mask is completed, robot 425 conveys the mask back to inspection station 22 for re-inspection. If contaminants are still found on the mask, another round of particle removal may be performed by particle removal station 24. If the mask cannot be satisfactorily cleaned even after repeat treatment, robot 425 preferably transfers the mask back to storage station 410 from removal from enclosure 405. Otherwise, the clean mask is passed to exposure tool 430 or 432, or it is returned to mask storage station 410 for future use.

It should be noted that although two exposure stations 430 and 432 are shown in FIG. 5, tool 400 may comprise a larger or smaller number of exposure stations. The controlled environment of enclosure 405 ensures that masks are exposed to a minimal number of particulate contaminants, by restricting human contact with the masks and by high air filtration or evacuation of the enclosure. The only regular access to the interior of tool 400 is through port 415 of mask storage station 410, as well as through a similar port (not shown in the figure) for moving process wafers into and out of exposure tools located within enclosure 405.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for semiconductor device fabrication, comprising:
    at least one lithography station, which is adapted to project a pattern of radiation from a mask onto a semiconductor wafer;
    a mask cleaning station, which is adapted to receive the mask from the at least one lithography station, to clean the mask so as to remove a contaminant therefrom, so that the cleaned mask may be transferred to the at least one lithography station;
    a robot, which is adapted to convey the mask between the at least one lithography station and the mask cleaning station;
    an enclosure, containing the at least one lithography station, the mask cleaning station and the robot, so that the mask is conveyed between the at least one lithography station and the mask cleaning station without human contact and without exposure to ambient air; and
    wherein the at least one lithography station comprises a plurality of exposure tools, commonly contained within the enclosure and served by the mask cleaning station.

2. Apparatus according to claim 1, and comprising a mask storage station, contained at least partly within the enclosure, wherein the mask storage station is adapted to store the mask, and wherein the robot is adapted to convey the mask between the mask storage station and the cleaning and lithography stations.

3. Apparatus according to claim 1, wherein the at least one lithography station comprises a radiation source for generating the radiation that is projected onto the semiconductor wafer, and wherein the radiation has a wavelength that is less than 160 nm.

4. Apparatus according to claim 1, wherein the at least one lithography station is adapted to project the pattern of radiation from the mask in the absence of a pellicle covering the mask.

5. Apparatus according to claim 1, and comprising an inspection station, which is adapted to determine position coordinates of the contaminant on the mask, and to convey the coordinates to the cleaning station, which is adapted to clean the mask locally at a location indicated by the coordinates.

6. Apparatus according to claim 5, wherein the inspection station is contained within the enclosure.

7. Apparatus according to claim 5, wherein the cleaning station comprises a vacuum source, which is adapted to apply suction at the location indicated by the coordinates.

8. Apparatus according to claim 7, wherein the cleaning station further comprises an inlet port, and the cleaning station is adapted to inject a fluid medium through the inlet port so that the fluid medium is deposited on the mask at the location indicated by the coordinates, prior to applying the suction thereto.

9. Apparatus according to claim 5, wherein the cleaning station comprises an inlet port, and the cleaning station is adapted to inject a pressurized cleaning medium through the inlet port so that the cleaning medium impinges on the mask at the location indicated by the coordinates.

10. Apparatus according to claim 1, wherein the cleaning station comprises a radiation source, which is adapted to generate a beam of electromagnetic energy, and wherein the cleaning station is adapted to controllably direct the beam of electromagnetic energy toward a location of the contaminant on the mask, causing the contaminant to be dislodged from the mask substantially without damage to the surface itself.

11. Apparatus according to claim 10, wherein the cleaning station comprises a gas inlet, and the cleaning station is adapted to inject an energy transfer medium through the gas inlet so that the medium is deposited on the mask at the location of the contaminant.

12. Apparatus according to claim 11, wherein the medium absorbs at least a portion of the electromagnetic energy incident on the mask, thereby causing local evaporation of the medium, which dislodges the contaminant.

13. Apparatus according to claim 12, wherein the electromagnetic energy comprises ultraviolet laser energy.

14. Apparatus according to claim 12, wherein the energy transfer medium comprises a carrier gas with a condensable vapor.

15. Apparatus according to claim 14, wherein the condensable vapor is water.

16. Apparatus according to claim 10, wherein the cleaning station is adapted to receive input position coordinates of the location of the contaminant on the mask, and to direct the medium and the beam so that the medium and beam are incident on the mask at the location indicated by the position coordinates.

17. Apparatus according to claim 16, and comprising an inspection station, which is adapted to determine the input position coordinates and to convey the coordinates to the cleaning station.

\* \* \* \* \*